(12) United States Patent
Chen et al.

(10) Patent No.: US 11,522,089 B2
(45) Date of Patent: Dec. 6, 2022

(54) DOUBLE-GLASS PHOTOVOLTAIC ASSEMBLY

(71) Applicant: SHANGHAI JA SOLAR TECHNOLOGY CO., LTD., Guangdong (CN)

(72) Inventors: Daoyuan Chen, Shanghai (CN); Xin Li, Shanghai (CN); Kai Zhang, Shanghai (CN); Lingling Liu, Shanghai (CN)

(73) Assignee: SHANGHAI JA SOLAR TECHNOLOGY CO., LTD., Guangdong (CN)

( * ) Notice: Subject to any disclaimer, the term of this patent is extended or adjusted under 35 U.S.C. 154(b) by 23 days.

(21) Appl. No.: 17/041,406

(22) PCT Filed: Jun. 28, 2019

(86) PCT No.: PCT/CN2019/093536
§ 371 (c)(1),
(2) Date: Sep. 24, 2020

(87) PCT Pub. No.: WO2020/113950
PCT Pub. Date: Jun. 11, 2020

(65) Prior Publication Data
US 2021/0043779 A1    Feb. 11, 2021

(30) Foreign Application Priority Data

Dec. 6, 2018 (CN) .......................... 201811487725.2
Mar. 15, 2019 (CN) .......................... 201910199346.1
May 7, 2019 (CN) .......................... 201920641985.4

(51) Int. Cl.
*H02S 30/10* (2014.01)
*H02S 40/34* (2014.01)
(Continued)

(52) U.S. Cl.
CPC ...... *H01L 31/0201* (2013.01); *H01L 31/0488* (2013.01); *H02S 30/10* (2014.12); *H02S 40/34* (2014.12)

(58) Field of Classification Search
CPC ......... H01L 31/02008; H01L 31/02013; H01L 31/02021; H02S 20/22–25; H02S 30/10; H02S 40/34
See application file for complete search history.

(56) References Cited

U.S. PATENT DOCUMENTS

2014/0360558 A1    12/2014  West et al.

FOREIGN PATENT DOCUMENTS

CN    201936900 U    8/2011
CN    206211932 U    5/2017
(Continued)

OTHER PUBLICATIONS

English machine translation of Chen et al. (CN 206211932), published May 31, 2017.*
(Continued)

*Primary Examiner* — Christina Chern
(74) *Attorney, Agent, or Firm* — Volpe Koenig (57) ABSTRACT

A double-glass photovoltaic assembly includes a laminate member, a junction box, and a first frame and a second frame disposed only at two long sides of the laminate member. The laminate member includes a cover plate glass, a first encapsulation adhesive film, a battery string, a second encapsulation adhesive film, a back plate glass, and a busbar. A through-hole is provided at the back plate glass. An end of the busbar is connected to the battery string. Another end of the busbar passes through the through-hole, and is bent to form a bent edge to be connected to the junction box. The bent edge of the busbar does not contact an edge of the through-hole. The double-glass photovoltaic assembly (Continued)

adopting a double-frame design can meet the requirements of load capacity.

12 Claims, 6 Drawing Sheets

(51) Int. Cl.
*H01L 31/02* (2006.01)
*H01L 31/048* (2014.01)

(56) References Cited

FOREIGN PATENT DOCUMENTS

| CN | 206864486 U | 1/2018 |
|----|----|----|
| CN | 109787549 A | 5/2019 |
| JP | 2010-212418 A | 9/2010 |
| JP | 2011-149219 A | 8/2011 |
| JP | 2013-247238 A | 12/2013 |
| JP | 2015-090967 A | 5/2015 |
| WO | 2010/122856 A1 | 10/2010 |

OTHER PUBLICATIONS

English machine translation of Ni et al. (CN206864486), published Jan. 9, 2018.*
English machine translation of Wu et al. (CN 201936900), published Aug. 17, 2011.*
Definition of "ellipse" from Wikipedia retrieved from https://en.wikipedia.org/wiki/Ellipse on Mar. 11, 2022.*
English machine translation of Hoshide et al. (JP 2015-090967), published May 11, 2015.*
Supplementary European Search Report, European Patent Application No. 19892626.3, dated Jun. 24, 2021, (9 pages).

* cited by examiner

DOUBLE-GLASS PHOTOVOLTAIC ASSEMBLY

The present application claims the priority of the following patent applications:

Chinese patent application No. 201811487725.2 filed on Dec. 6, 2018 with the Chinese National Intellectual Property Administration with an Invention title of "A DOUBLE-GLASS PHOTOVOLTAIC ASSEMBLY", Chinese patent application No. 201910199346.1 filed on Mar. 15, 2019 with the Chinese National Intellectual Property Administration with an Invention title of "A DOUBLE-GLASS PHOTOVOLTAIC ASSEMBLY", and Chinese patent application No. 201920641985.4 filed on May 7, 2019 with the Chinese National Intellectual Property Administration with an Invention title of "ELASTIC PROTECTOR FOR A FRAME OF A PHOTOVOLTAIC ASSEMBLY, A FRAME OF A PHOTOVOLTAIC ASSEMBLY AND A PHOTOVOLTAIC ASSEMBLY", the contents of all which are incorporated herein by reference in their entireties.

TECHNICAL FIELD

The present disclosure relates to the technical field of photovoltaics, in particular to a double-glass photovoltaic assembly.

BACKGROUND

In the double-glass photovoltaic assembly, that is a photovoltaic assembly encapsulated by double-sided glass, cover and back plates of its laminate member are glass plates. According to the types of solar cells used in double-glass photovoltaic assemblies, double-glass assemblies can be divided into single-sided double-glass photovoltaic assemblies (the solar cells are single-sided solar cells, and only the front of the assembly can be used to generate power) and double-sided double-glass photovoltaic assemblies (the solar cells are double-sided solar cells, and both the front and back of the assembly can be used to generate power).

Figure 1:
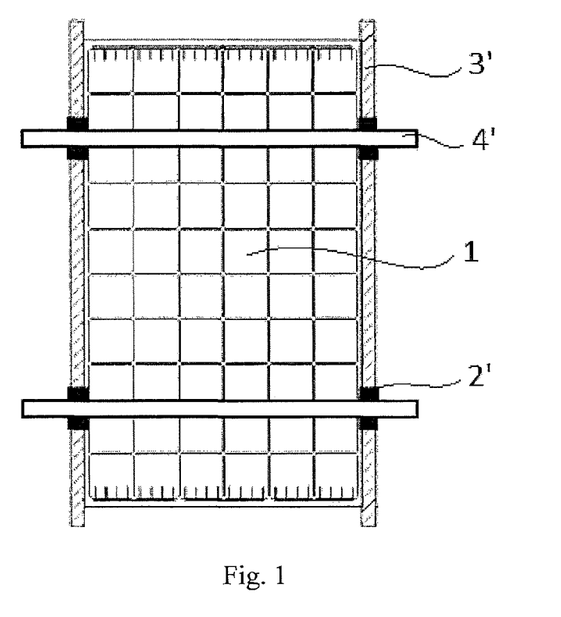
FIG. 1 is a schematic diagram illustrating the installation method of an existing single-sided double-glass assembly including segmented frames.

In photovoltaic power generation systems, single-sided double-glass photovoltaic assemblies are usually installed in a manner as shown in FIG. 1. Segmented frames 2' are mounted on opposite long sides of the laminate member 1, and the assembly is mounted on a bracket by the segmented frames 2'. The bracket includes longitudinal brackets 3' arranged along the long side direction of the laminate member 1 and transverse brackets 4' arranged along the short side direction of the laminate member 2.

Figure 2:
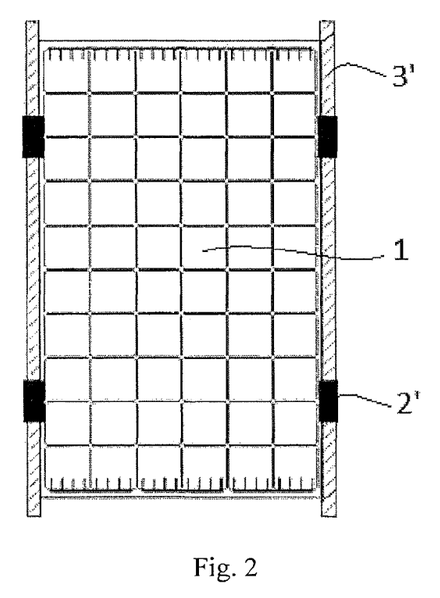
FIG. 2 is a schematic diagram illustrating the installation method of an existing double-sided double-glass assembly including segmented frames.

Since the front and back of the double-sided double-glass assembly can both be used to generate power, the transverse brackets 4' installed in the manner as shown in FIG. 1 will affect light incident on the back and thus the power generation on the back of the double-glass assembly. Therefore, in the photovoltaic power generation system, the double-sided double-glass assembly usually adopts the following installation methods:

The first method: as shown in FIG. 2, a segmented frame 2' are mounted on both long sides of the laminate member 1, and the assembly is mounted on the longitudinal bracket 3' by the segmented frame 2' without arranging the transverse bracket 4'. The problem with this installation method is that the load capacity of the double-sided double-glass assembly cannot meet the requirement of 5400 Pa as defined in the IEC (International Electrotechnical Commission) standard.

Figure 3:
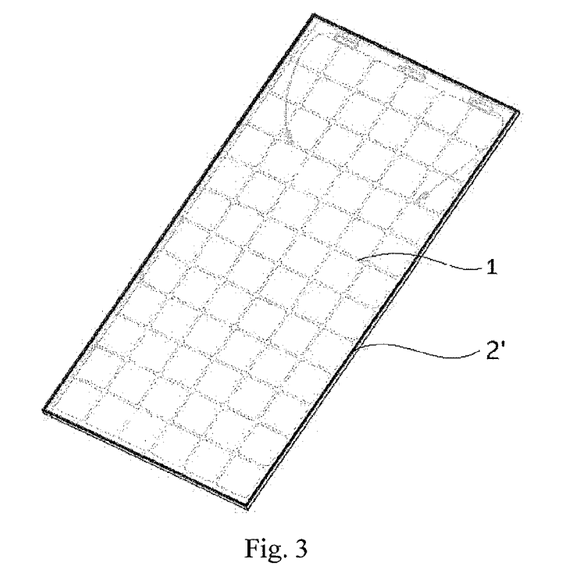
FIG. 3 is a schematic diagram illustrating the installation method of an existing double-sided double-glass assembly in which frames are provided on all the four sides.
Figure 4:
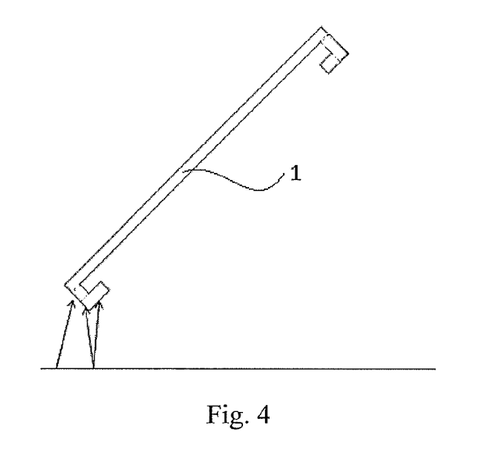
FIG. 4 is a schematic diagram illustrating a path of light from the ground in the installation method shown in FIG. 3.

The second method: as shown in FIG. 3, frames 2' is installed around the laminate member 1, and the assembly is installed on the longitudinal bracket by the frames on the long sides. And the back of the assembly is also not blocked by a transverse bracket. As shown in FIG. 4, the problem with this method is that because the assembly is usually arranged obliquely relative to the ground, the lower side frame of the assembly will block the light from the ground from reaching the back of the assembly, causing the decrease of the power generation. And the lower side frame is likely to suffers from accumulation of dust and snow so that hot spots will form at the positions of the accumulated dust and snow, which will not only decrease the power generation of the assembly, but also cause damage to the assembly to a certain extent.

SUMMARY

Based on the foregoing, the embodiments of the present disclosure provide a double-glass photovoltaic assembly that can not only meet the load capacity requirement, but also not affect the power generation on the back side.

The specific technical solutions are as follows:

The present embodiment provides a double-glass photovoltaic assembly, which comprises a laminate member, a junction box, as well as a first frame and a second frame disposed only at two long sides of the laminate member;

the laminate member comprising a cover plate glass, a first encapsulation adhesive film, a battery string, a second encapsulation adhesive film, a back plate glass, and a busbar;

a through-hole being provided on the back plate glass;

one end of the busbar being connected to the battery string, while the other end of the busbar passing through the through-hole and being bent to form a bending edge to be connected to the junction box;

the bending edge of the busbar being not in contact with an edge of the through-hole.

In an alternative implementation, the first frame and the second frame are axisymmetrically provided with the longitudinal centerline of the laminate member as the axis of symmetry.

In another alternative implementation, the distance between the bending edge of the busbar and the edge of the through-hole is more than 0.1 mm.

In another alternative implementation, the distance between the bending edge of the busbar and the edge of the through-hole is more than 1 mm.

In another alternative implementation, there is a distance between the two ends of the first frame and the two ends of the second frame and the two short sides of the laminate member.

In another alternative implementation, the first frame is axisymmetrically provided with the transverse centerline of the laminate member as the axis of symmetry, and/or the second frame is axisymmetrically provided with the transverse centerline of the laminate member as the axis of symmetry, In another alternative implementation, the length of the first frame and the length of the second frame are equal.

In another alternative implementation, the ratio of the length of the first frame and the second frame to the length of the long side of the laminate member may be more than 50%.

In another alternative implementation, the first frame and the second frame include a first mounting plate, a second mounting plate, and a connecting plate, wherein the first mounting plate and the second mounting plate are arranged oppositely, and wherein a first side of the first mounting plate and a first side of the second mounting plate are respectively connected with the connecting plate; and the laminate member is disposed between the first mounting plate and the second mounting plate, and is fixed to the first mounting plate and the second mounting plate via an adhesive.

In another alternative implementation, an elastic protector is provided between the first mounting plate and the second mounting plate; and the elastic protector is formed as a U-shaped main body, which includes: an upper portion and a lower portion arranged oppositely; and a connecting portion connecting the upper portion and the lower portion; wherein the upper portion, the lower portion and the connecting portion are respectively fixed to the first connecting plate, a second connecting plate and a connecting plate; and wherein a part of the laminate member is located between the upper portion and the lower portion, and the part of the laminate member located outside of the elastic protector is fixed to the first connecting plate and the second connecting plate via the adhesive.

In another alternative implementation, a protrusion is formed above the upper portion of the U-shaped body; and a slot that cooperates with the protrusion is formed on a surface of the first mounting plate opposite to the second mounting plate.

In another alternative implementation, the free ends of the upper portion and the lower portion of the U-shaped body are respectively formed with covering portions which respectively cover the second side edge of the first mounting plate and the second side edge of the second mounting plate.

In another alternative implementation, the covering portions are formed as snapping portions extending to the outside of the U-shaped main body.

In another alternative implementation, the number of elastic protectors is at least two, and two of the elastic protectors are respectively located at the two ends of the first connecting plate.

In another alternative implementation, each of the cell strings includes a plurality of solar cells which are single-sided solar cells or double-sided solar cells.

In another alternative implementation, each of the cell strings includes a plurality of solar cells which are whole-piece solar cells or sliced solar cells.

The present embodiment also provides another double-glass photovoltaic assembly, which comprises a laminate member, and a first frame and a second frame disposed respectively on two long sides of the laminate member.

The first frame and the second frame are axisymmetrically provided with the longitudinal centerline of the laminate member as the axis of symmetry.

In an alternative implementation, an upper end of first frame, an upper end of the second frame and an upper short side of the laminate member are flush.

In another alternative implementation, there is a distance between the two ends of the first frame, the two ends of the second frame and the two short sides of the laminate member.

In another alternative implementation, the first frame is axisymmetrically provided with the transverse centerline of the laminate member as the axis of symmetry, and the second frame is axisymmetrically provided with the transverse centerline of the laminate member as the axis of symmetry.

In another alternative implementation, the ratio of the length of the first frame and the second frame to the length of the laminate member may be more than 50%.

The technical solutions according to the embodiments of the present disclosure brings the following benefit including at least:

the embodiment of the present disclosure provides a double-frame double-glass photovoltaic assembly in which frames are only provided on both long sides of the laminate member. When the double-glass photovoltaic assembly is installed, the assembly is mounted on the longitudinal bracket by means of the frames on the two long sides. Also, the bending edge of the busbar in the double-glass photovoltaic assembly is not in contact with the edge of the through-hole in the glass back plate. Therefore, the double-glass photovoltaic assembly can meet the load capacity requirements without arranging a transverse bracket on the back. And due to the lack of frame on the lower side, the light from the ground will not be blocked from reaching the back of the assembly and thus will not affect the power generation on the back of the double-glass photovoltaic assembly. Also, since there is no frame on the lower side of the double-glass photovoltaic assembly according to the embodiments of the present disclosure, it is not likely to accumulate dust and snow, which reduces the risk of hot spots formed due to dust and snow. In addition, the "double-frame" design according to the embodiments of the present disclosure can also reduce the weight of double-glass photovoltaic assemblies and reduce the cost thereof.

The reference numbers in the figures refer to:
1—laminate member, 11—solar cell sheet, 12—busbar, 121—bending edge, 13—through-hole,
131—edge of through-hole, 21—first frame, 22—second frame, 3—junction box, 4—intermediate clamp,
5—edge clamp, a1—first mounting plate, a2—second mounting plate, a3—third mounting plate,
a31—mounting hole, a4—connecting plate, X—elastic protector, X1—U—shaped body, X11—upper portion, X12—lower portion, X13—connecting portion, X14—covering portion, X2—protrusion,
2'—frame of existing double-glass photovoltaic assembly
3'—longitudinal bracket
4'—transverse bracket

DETAILED DESCRIPTION

Figure 5:
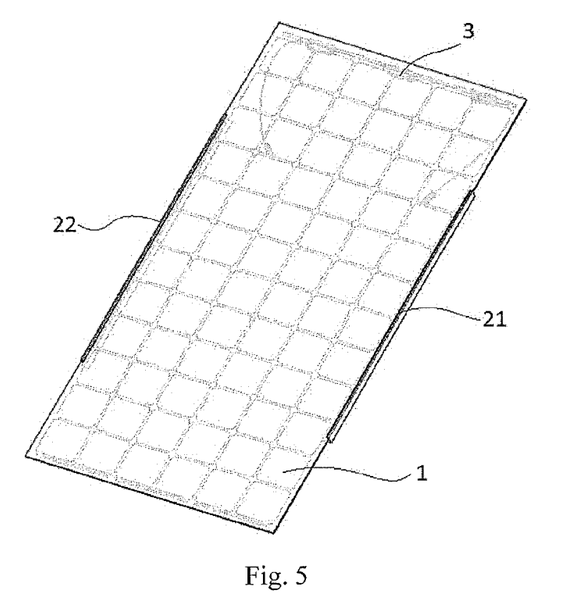
FIG. 5 is a schematic structural diagram of a double-glass photovoltaic assembly according to an embodiment of the present disclosure.

The present embodiment provides a double-glass photovoltaic assembly. FIG. 5 illustrates the structure of the double-glass photovoltaic assembly according to the present embodiment. As shown in FIG. 5, the double-glass photovoltaic assembly comprises a laminate member 1, a junction box, as well as a first frame 21 and a second frame 22 disposed only at two long sides of the laminate member 1. In the present embodiment, no frames are provided on the two short sides of the laminate member 1.

The laminate member 1 comprising a cover plate glass, a first encapsulation adhesive film, a battery string, a second encapsulation adhesive film, a back plate glass in which a through-hole 13 is provided, and a busbar 12.

The cover plate glass, the first encapsulation adhesive film, the battery string, the second encapsulation adhesive film and the back plate glass are stacked in order. One end of the busbar 12 is connected to the battery string, while the other end of the busbar 12 passes through the through-hole 13 and is bent to form a bending edge 121 to be connected to the junction box 3.

Figure 6:
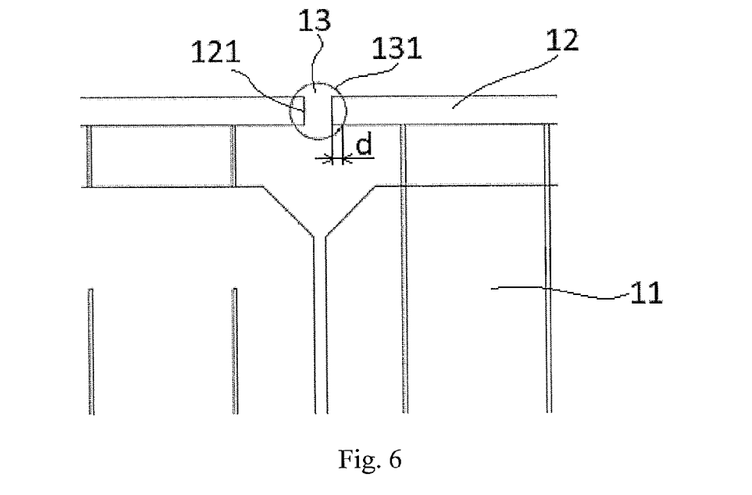
FIG. 6 is a schematic structural diagram illustrating the positional relation between the bending edge of the busbar and the edge of the through-hole of the back plate in the double-glass photovoltaic assembly according to an embodiment of the present disclosure.

As shown in FIG. 6, the bending edge 121 of the busbar 12 is not in contact with an edge 131 of the through-hole 121.

Figure 7:
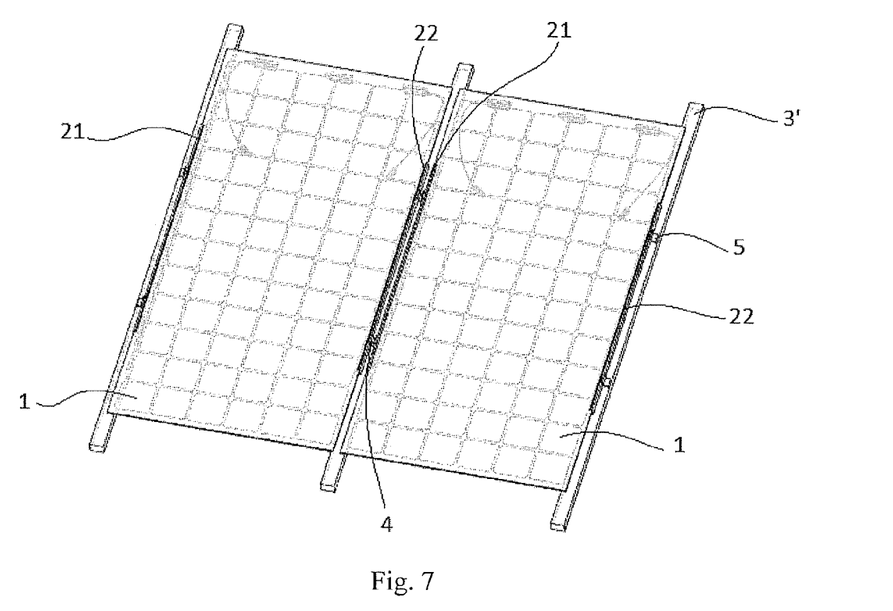
FIG. 7 is a schematic diagram illustrating the installation method of a double-glass photovoltaic assembly according to an embodiment of the present disclosure.
Figure 8:
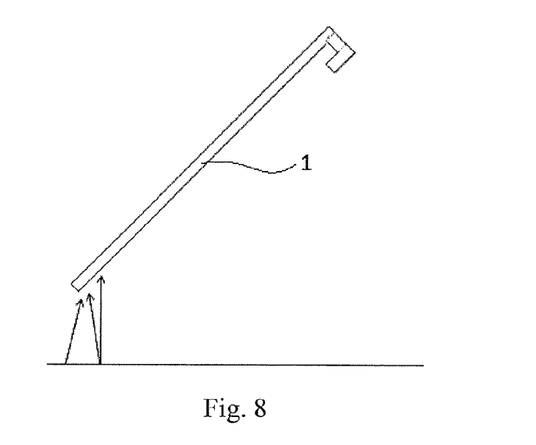
FIG. 8 is a schematic diagram illustrating a path of light from the ground in a double-glass photovoltaic assembly according to an embodiment of the present disclosure after installation.

As shown in FIG. 7, when the double-glass photovoltaic assembly according to the embodiment of the present disclosure is being installed, the double-glass photovoltaic assembly is installed on the longitudinal bracket by the first frame 21 and the second frame 22, so that the double-glass photovoltaic assembly is arranged obliquely with one short side of the laminate member 1 being upward (away from the ground) and the other short side of the laminate member 1 being downward (close to the ground). No transverse bracket is arranged on the back of the double-glass photovoltaic assembly.

In the embodiments of the present disclosure, the laminate member 1 is substantially rectangular. For the ease of description, after the double-glass photovoltaic assembly is installed, the upper short side of that the laminate member 1 is called an upper side, and the lower short side is called a lower side. The ends of the first frame 21 and the second frame 22 which are located at upper side are referred to as upper ends, and the ends which are located at lower side are referred to as lower ends. In the embodiments of the present disclosure, "longitudinal" refers to the direction that is parallel to the long sides of the laminate member 1, and "transverse" refers to the direction that is parallel to the short sides of the laminate member 1.

In the double-glass photovoltaic assembly according to the embodiments of the present disclosure, since no frame is provided on the lower side, light from the ground will not be blocked from reaching the back of the assembly, so that the power generation on the back of the double-glass photovoltaic assembly will not be affected.

Meanwhile, in the double-glass photovoltaic assembly according to the embodiments of the present disclosure, the bending edge 121 of the busbar 12 is not in contact with an edge 131 of the through-hole of the back plate glass, that is, the distance between the bending edge 121 of the busbar 12 and the edge 131 of the through-hole of the back plate glass is more than zero.

As shown in FIG. 6, in the embodiment of the present disclosure, the bending edge 121 of the busbar 12 refers to the part where the busbar 12 is bent. In the laminate member 1, a portion of the busbar 12 is located inside the glass of the back plate, and the other portion is located outside the glass of the back plate. The bending edge is the part connecting the two portions.

In the existing double-glass photovoltaic assembly, the bending edge 121 of the busbar 12 is in direct contact with the edge 131 of the through-hole of the glass of the back plate, so that the strength of the glass of the back plate will be impaired and even the glass of the back plate is likely to burst when the double-glass assembly is subject to a load.

However, in the embodiment of the present disclosure, the bending edge 121 of the busbar 12 is not in contact with the edge 131 of the through-hole of the glass of the back plate. Therefore, the double-glass photovoltaic assembly provided by the embodiment of the present disclosure is provided with frames only on the two long sides, and it can still pass three cycles of 5400 Pa/2400 Pa load test without a transverse bracket on the back, meeting the requirements of the IEC standard.

In addition, since there is no frame on the lower side of the double-glass photovoltaic assembly according to the embodiments of the present disclosure, it is not likely to accumulate dust and snow, which reduces the risk of hot spots formed due to dust and snow. The "double-frame" design can also reduce the weight of double-glass photovoltaic assemblies and reduce the cost thereof.

In the embodiment of the present disclosure, the distance between the bending edge 121 of the busbar 12 and the edge 131 of the through-hole may be more than 0.1 mm, such as 0.2 mm, 0.3 mm, 0.4 mm, or 0.5 mm, etc., and further it may be more than 1 mm, for example 1.5 mm, 2 mm, 2.5 mm, 3 mm, 3.5 mm, 4 mm, 4.5 mm, or 5 mm, etc. It shall be noted that, as shown in FIG. 6, in a double-glass photovoltaic assembly, there are usually two busbars 12 passing through the through-hole 13 and being bent. This makes it necessary, when designing the distance between the bending edge 121 of the busbar 12 and the edge 131 of the through-hole, to make the distance between the bending edges 121 of the two busbars 12 greater than zero, that is, to avoid the bending edges 121 of the two bus bars 12 to contact with each other.

It should also be noted that in the double-glass photovoltaic assembly, the through-hole 13 of the glass of the back plate is usually circular, the edge 131 of the through-hole is arc-shaped, and the bending edge 121 of the busbar 12 is usually linear, so the distance between the bending edge 121 of the busbar 12 and the edge 131 of the through-hole is not the same everywhere. In this case, in the embodiment of the present disclosure, the distance between the bending edge 121 of the busbar 12 and the edge 131 of the through-hole refers to the minimum distance therebetween (the distance indicated by the reference sign d in FIG. 6).

In the embodiment of the present disclosure, the first frame 21 and the second frame 22 may be axisymmetrically provided with the longitudinal centerline of the laminate member 1 as the axis of symmetry, that is, the upper and lower ends of the first frame 21 and the second frame 22 are respectively flush.

Of course, the first frame 21 and the second frame 22 may also not be axisymmetrically provided with the longitudinal centerline of the laminate member 1 as the axis of symmetry.

In the embodiment of the present disclosure, there is a distance between the two ends of the first frame 21 and the two ends of the second frame 22 and the two short sides of the laminate member 1.

For the first frame 21, there may only be a distance between the upper end (or lower end) and the upper side (or lower side) of the laminate member 1. For the second frame 22, there may only be a distance between the upper end (or lower end) and the upper side (or lower side) of the laminate member 1.

In the embodiment of the present disclosure, the first frame 21 may also be axisymmetrically provided with the transverse centerline of the laminate member 1 as the axis of symmetry, and the second frame 22 may also be axisymmetrically provided with the transverse centerline of the laminate member 1 as the axis of symmetry.

The length of the first frame 21 and the length of the second frame 22 may be or not be equal.

In the embodiment of the present disclosure, the ratio of each of the lengths of the first frame 21 and the second frame 22 to the length of the long side of the laminate member 1 may be more than 50%, such as 50%, 55%, 60%, 65%, 70%, 75%, 80%, 85%, 90%, 95%, or 100%, etc. For different versions of the assemblies, the lengths of the first frame 21 and the second frame 22 can be adjusted adaptively. For example, for an assembly of 60-sheet version, the ratio of each of the lengths of the first frame 21 and the second frame 22 to the length of the long side of the laminate member 1 may be greater than 50% (for example, 50%, 55%, 60%, 65%, 70%, 75%, 80%, 85%, 90%, 95%, or 100%, etc.); for an assembly of 72-sheet version, the ratio of each of the lengths of the first frame 21 and the second frame 22 to the length of the long side of the laminate member 1 may be greater than 60% (for example, 60%, 65%, 70%, 75%, 80%, 85%, 90%, 95%, or 100%, etc.).

Figure 9:
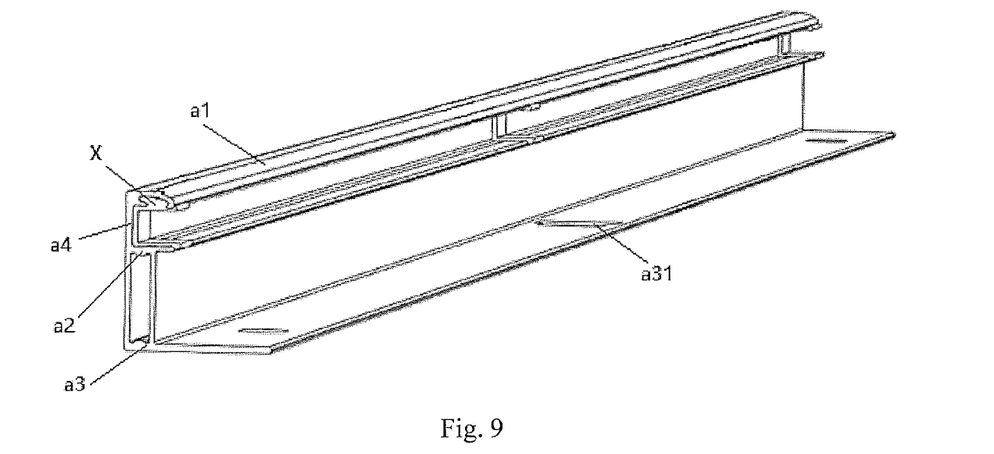
FIG. 9 is a schematic structural diagram of an alternative frame of a double-glass photovoltaic assembly according to an embodiment of the present disclosure.

In the embodiment of the present disclosure, the first frame 21 and the second frame 22 may adopt the frame structure shown in FIG. 9. Specifically, the frame includes a first mounting plate a1, a second mounting plate a2, and a connecting plate a4. The first mounting plate a1 and the second mounting plate a2 are arranged oppositely, and the first side of the first mounting plate a1 and the first side of the second mounting plate a2 are respectively connected with the connecting plate a4;

the laminate member 1 is disposed between the first mounting plate a1 and the second mounting plate a2, and is fixed to the first mounting plate a1 and the second mounting plate a2 via an adhesive.

As shown in FIG. 9, the frame may further include a third mounting plate a3 which is disposed opposite to the second mounting plate a2, and the second mounting plate a2 is located between the first mounting plate a1 and the third mounting plate a3, and the first side of the third mounting plate a3 is also connected with the connecting plate a4. In a possible implementation, the first mounting plate a1, the second mounting plate a2, and the third mounting plate a3 are substantially parallel, and the connecting plate a4 is perpendicular to the first mounting plate a1, the second mounting plate a2, and the third mounting plate a3. The third mounting plate a3 is used for installing the double-glass photovoltaic assembly with the bracket.

Generally speaking, the first mounting plate a1, the second mounting plate a2, and the third mounting plate a3 are substantially rectangular. For ease of description in the embodiments of the present disclosure, the two side edges of the first mounting plate a1 (the second mounting plate a2 and the third mounting plate) in the width direction are called the two sides of the first mounting plate a1 (the second mounting plate a2 and the third mounting plate a3), and the two side edges of the first mounting plate a1 (the second mounting plate a2 and the third mounting plate) in the length direction are called the two ends of the first mounting plate a1 (the second mounting plate a2 and the third mounting plate a3).

The double-glass photovoltaic assembly provided by the embodiment of the present disclosure may be installed with a bracket in a manner shown in FIG. 7. Specifically, a longitudinal bracket 3' is fixed between two adjacent double-glass photovoltaic assemblies by an intermediate clamp 4, and the outer side of the outermost double-glass photovoltaic assembly is fixed to the longitudinal bracket 3' by an edge clamp 5. The intermediate clamp 4 (edge clamp 5) presses the frames of the double-glass photovoltaic assembly against the longitudinal brackets 3'. And the intermediate clamp 4 (edge clamp 5) and the longitudinal brackets 3' are correspondingly provided with mounting holes through which bolts pass so as to fix the intermediate clamp 4 (edge clamp 5) with the longitudinal bracket 3', thereby fixing the double-glass photovoltaic assembly with the longitudinal bracket 3'.

Figure 11:
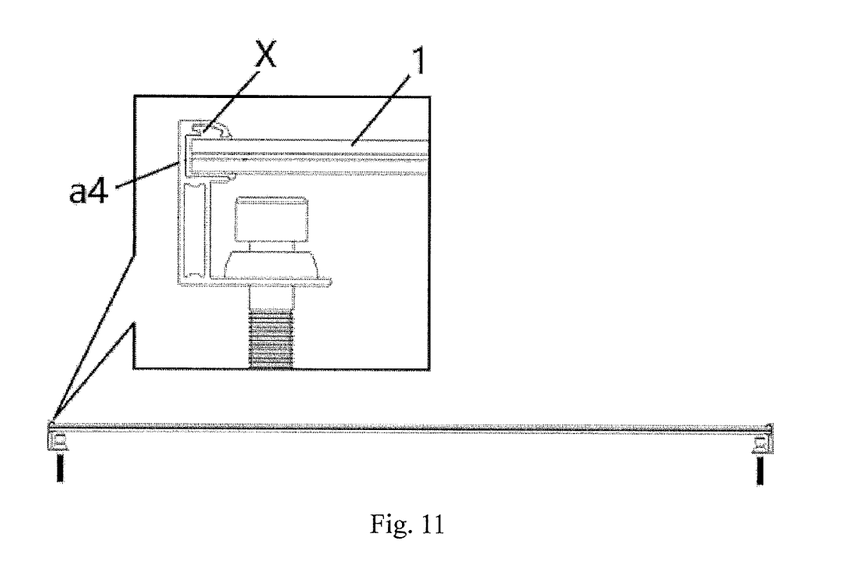
FIG. 11 is a schematic diagram illustrating the installation method of a double-glass photovoltaic assembly according to an embodiment of the present disclosure.

Alternatively, the double-glass photovoltaic assembly according to the embodiments of the present disclosure may also be installed with the brackets in a manner shown in FIG. 11. Specifically, as shown in FIG. 9, mounting holes a31 are provided on the third mounting plate a3 of the frame. As shown in FIG. 11, bolts respectively passes through each of the mounting holes a31 on the third mounting plate a3 and the mounting hole on the longitudinal bracket 3' to directly fix the double-glass photovoltaic assembly with the longitudinal bracket 3'.

In the embodiment of the present disclosure, the adhesive for fixing the laminate member 1 to the first mounting plate a1 and the second mounting plate a2 may be a sealant such as silicone.

Figure 10:
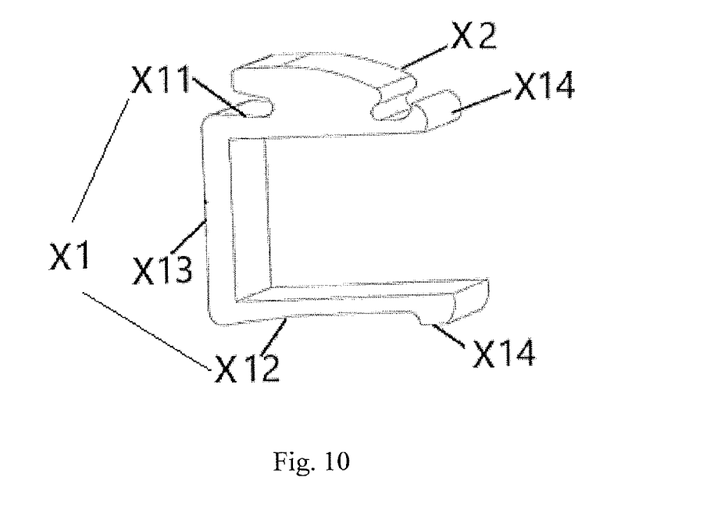
FIG. 10 is a schematic structural diagram of an elastic protector in the double-glass photovoltaic assembly according to an embodiment of the present disclosure.

As shown in FIG. 9, in the double-glass photovoltaic assembly according to the embodiments of the present disclosure, an elastic protector X may be provided between the first mounting plate a1 and the second mounting plate a2 of the first frame 21 and the second frame 22. As shown in FIG. 10, the elastic protector X is formed as a U-shaped main body X1, which includes: an upper portion X11 and a lower portion X12 arranged oppositely; and a connecting portion X13 connecting the upper portion X11 and the lower portion X12; wherein the upper portion X11, the lower portion X12 and the connecting portion X13 are respectively fixed to the first connecting plate a1, a second connecting plate a2 and a connecting plate a4.

In the embodiment of the present disclosure, the elastic protector X does not cover the entire first and second mounting plates a1, a2 in the length direction of the first and second mounting plates a1, a2, that is, only a part of the laminate member 1 is located between the upper portion X11 and the lower portion X22 of the elastic protector X. And the part of the laminate member located outside of the elastic protector X is fixed to the first connecting plate a1 and the second connecting plate a2 via the adhesive, and the laminate member 1 may not be fixed to the elastic protector X. It can be understood that by providing the elastic protector X, there are gaps between the edge of the laminate member 1 and the first mounting plate a1, the second mounting plate a2 and the connecting plate a4. In this way, when a load is applied on the double-glass photovoltaic assembly, the glass of the double-glass assembly has a certain room for movement, in addition to the buffering effect of the elastic protector, the glass of the double-glass photovoltaic assembly is not likely to be crushed, thereby further improving the load capacity of the double-frame photovoltaic assembly of the embodiment of the present disclosure.

In the embodiment of the present disclosure, the elastic protector 10 may be fixed to the first mounting plate a1, the second mounting plate a2 and the connecting plate a4 by an adhesive (such as silicon), or may be fixed to the first mounting plate a1, the second mounting plate a2 and the connecting plate a4 by a mechanical connecting structure.

Optionally, as shown in FIG. 10, a protrusion X2 is further formed on the upper portion X11 of the U-shaped body X1; and a slot that cooperates with the protrusion X2 is formed on a surface of the first mounting plate a1 opposite to the second mounting plate a2, and the protrusion X2 is snapped into the slot of the first mounting plate a1.

Optionally, the free ends of the upper portion X11 and the lower portion 112 of the U-shaped body 11 are respectively formed with a covering portion X14, so as to respectively cover the second side edge of the first mounting plate a1 and the second side edge of the second mounting plate a2. The provision of the covering portion X14 makes it easy to place the edge of the laminate member 1 between the first mounting plate a1 and the second mounting plate a2, and can prevent the upper portion X11 and the lower portion X12 of the elastic protector X from shrinking back and wrinkling during the process of placing the edge of the laminate member 1 between the first mounting plate a1 and the second mounting plate a2. Preferably, the covering portions X14 are formed as snapping portions extending to the outside of the U-shaped main body X1, and the snapping portions are respectively snapped on the second side edge of the first mounting plate a1 and the second side edge of the second mounting plate a2.

In a possible implementation of the embodiments of the present disclosure, the number of elastic protectors X is at least two, and two of the elastic protectors X are respectively located at the two ends of the first connecting plate a1. By providing elastic protectors X at the two ends of the first connecting plate a1 (that is, the second connecting plate a2), it is possible to prevent the adhesive used to bond the laminate member 1 and the frame from overflowing from the two ends of the first frame 21 and the second frame 22. This ensures the cleanliness during the preparation process of the double-glass photovoltaic assembly provided by the embodiment of the present disclosure, and also ensures the reliability of the adhesion between the laminate member 1 and the frame.

The number of elastic protectors X arranged between the elastic protectors X at both ends is not strictly limited in the embodiment of the present disclosure, and can be determined according to the lengths of the first frame 21 and the second frame 22.

In the embodiment of the present disclosure, the elastic protectors X may be rubber parts, silicone parts, thermoplastic parts, or other elastic parts.

Further, a double-glass photovoltaic assembly usually includes a plurality of cell strings, and each cell string includes a plurality of solar cells 11 which are connected by an interconnection bar. And the busbars 12 collect the current of the cell strings by being connected with the interconnection bars.

The solar cell sheet may be single-sided solar cells or double-sided solar cells, that is, the double-glass photovoltaic assembly structure according to the embodiments of the present disclosure is not only applicable to double-sided double-glass photovoltaic assemblies, but also applicable to single-sided double-glass photovoltaic assemblies.

The solar cells 11 may be whole-piece solar cells or sliced solar cells. The whole-piece solar cell refers to the cell that is square or square with cut corners. The sliced solar cell is the one that is obtained by cutting a whole-piece solar cell, wherein the shape may be rectangular and the cutting ratio may be one half, one third, a quarter, and a fifth, etc. The 60 sheets and 72 sheets mentioned in the assemblies of 60-sheet and 72-sheet versions in the above refer to the total number of the whole-piece solar cells in an assembly.

In the embodiment of the present disclosure, the position of the junction box 3 can be determined according to the version of the assemblies.

For some versions of assemblies, the junction box 3 is provided close to one short side of the laminate member 1, such as a whole-piece solar cell photovoltaic assembly. It should be noted that when this type of double-glass photovoltaic assembly is installed, the short side close to the junction box 3 faces upward and away from the ground.

For some versions of assemblies, the junction box 3 is provided in the middle position along the length of the laminate member 1, such as a half-slice (one-half-slice) solar cell photovoltaic assembly.

It can be understood that the position of the through-hole 13 on the glass of the back plate corresponds to the position of the junction box 3.

In the dual-glass photovoltaic assembly provided by the embodiment of the present disclosure, the solar cells 11 can also be arranged in an "imbricated" manner, that is, the edges of adjacent solar cells in the same string overlap. For double-glass photovoltaic assemblies arranged in an "imbricated" manner, the junction box is arranged on the back of the laminate member 1 and close to one long side of the laminate member 1.

The present embodiment also provides another double-glass photovoltaic assembly, which comprises a laminate member 1, and a first frame 21 and a second frame 22 disposed respectively on two long sides of the laminate member 1.

Optionally, the first frame 21 and the second frame 22 are axisymmetrically provided with the longitudinal centerline of the laminate member 1 as the axis of symmetry.

Optionally, the upper end of first frame 21, the upper end of the second frame 22 and the upper short side of the laminate member 1 are flush.

Optionally, there is a distance between the two ends of the first frame 21, the two ends of the second frame 22 and the two short sides of the laminate member 1.

Optionally, the first frame 21 is axisymmetrically provided with the transverse centerline of the laminate member 1 as the axis of symmetry, and the second frame 22 is axisymmetrically provided with the transverse centerline of the laminate member 1 as the axis of symmetry.

While the above-mentioned embodiments are preferred embodiments of the present disclosure, the embodiments of the present disclosure are not limited to the above-mentioned embodiments. Any other changes, modifications, substitutions, combinations made without departing from the spirit and principle of the present disclosure should be equivalent replacements, and thus are all included in the protection scope of the present disclosure.

What is claimed is:

1. A double-glass photovoltaic assembly comprising a laminate member, a junction box, as well as a first frame and a second frame disposed only at two long sides of the laminate member;
   wherein the laminate member comprises a cover plate glass, a first encapsulation adhesive film, a battery string, a second encapsulation adhesive film, a back plate glass, and a busbar;
   a circular through-hole is provided on the back plate glass, wherein the circular through-hole is a circle;
   one end of the busbar is connected to the battery string, while the other end of the busbar passes through the through-hole and is bent to form a bending edge to be connected to the junction box;
   the bending edge of the busbar is not in contact with the whole arc-shaped edge of the through-hole, and
   wherein there is a distance between two ends of the first frame and two ends of the second frame and two short sides of the laminate member, respectively; and the ratio of each of the lengths of the first frame and the second frame to the length of the long side of the laminate member is 65%.

2. The double-glass photovoltaic assembly according to claim 1, wherein a distance between the bending edge of the busbar and the arc-shaped edge of the through-hole is more than 0.1 mm.

3. The double-glass photovoltaic assembly according to claim 2, wherein the distance between the bending edge of the busbar and the arc-shaped edge of the through-hole is more than 1 mm.

4. The double-glass photovoltaic assembly according to claim 1, wherein the first frame and the second frame are axisymmetrically provided with the longitudinal centerline of the laminate member as the axis of symmetry.

5. The double-glass photovoltaic assembly according to claim 3, wherein the first frame is axisymmetrically provided with the transverse centerline of the laminate member as the axis of symmetry, and/or the second frame is distributed symmetrically about the transverse centerline of the laminate member as the axis of symmetry.

6. The double-glass photovoltaic assembly according to claim 1, wherein the length of the first frame and the length of the second frame are equal.

7. The double-glass photovoltaic assembly according to claim 1, wherein the first frame and the second frame include a first mounting plate, a second mounting plate, and a connecting plate, wherein the first mounting plate and the second mounting plate are arranged oppositely, and wherein a first side of the first mounting plate and a first side of the second mounting plate are respectively connected with the connecting plate; and
   the laminate member is disposed between the first mounting plate and the second mounting plate, and is fixed to the first mounting plate and the second mounting plate via an adhesive.

8. The double-glass photovoltaic assembly according to claim 7, wherein an elastic protector is provided between the first mounting plate and the second mounting plate;
   and in that the elastic protector is formed as a U-shaped main body, which includes:
   an upper portion and a lower portion arranged oppositely; and
   a connecting portion connecting the upper portion and the lower portion;
   wherein the upper portion, the lower portion and the connecting portion are respectively fixed to the first mounting plate, the second mounting plate and the connecting plate;
   and wherein a part of the laminate member is located between the upper portion and the lower portion.

9. The double-glass photovoltaic assembly according to claim 8, wherein a protrusion is formed on the upper portion of the U-shaped body; and
   a slot that cooperates with the protrusion is formed on a surface of the first mounting plate opposite to the second mounting plate.

10. The double-glass photovoltaic assembly according to claim 8, wherein free ends of the upper portion and the lower portion of the U-shaped body are respectively formed with a covering portion which respectively covers a second side edge of the first mounting plate and a second side edge of the second mounting plate.

11. The double-glass photovoltaic assembly according to claim 10, wherein the covering portions are formed as snapping portions extending outward from the U-shaped main body.

12. The double-glass photovoltaic assembly according to claim 1, wherein the battery string includes a plurality of solar cells which are single-sided solar cells or double-sided solar cells; and
   the solar cells are whole-piece solar cells or sliced solar cells.

* * * * *